(12) United States Patent
Smith et al.

(10) Patent No.: US 6,373,409 B1
(45) Date of Patent: Apr. 16, 2002

(54) METHOD AND COMPUTER PROGRAM PRODUCT FOR IMPLEMENTING TEXT CONVERSION TABLE COMPRESSION

(75) Inventors: Christopher Robert Smith; James Lee Wright, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/596,659

(22) Filed: Jun. 19, 2000

(51) Int. Cl.[7] .................................................. H03M 7/00
(52) U.S. Cl. .............................. 341/60; 341/11; 341/50; 341/55; 341/61; 341/63
(58) Field of Search ........................ 341/60, 50, 51–63

(56) References Cited

U.S. PATENT DOCUMENTS

| | | | | |
|---|---|---|---|---|
| 4,899,147 A | * | 2/1990 | Schiavo et al. | 341/60 |
| 4,988,998 A | * | 1/1991 | O'Brien | 341/55 |
| 5,049,881 A | * | 9/1991 | Gibson et al. | 341/95 |
| 5,229,768 A | * | 7/1993 | Thomas | 341/51 |
| 6,236,341 B1 | * | 5/2001 | Dorward et al. | 341/60 |

* cited by examiner

Primary Examiner—Michael Tokar
Assistant Examiner—Lam T. Mai
(74) Attorney, Agent, or Firm—Joan Pennington

(57) ABSTRACT

A method and computer program product are provided for implementing text conversion table compression. For implementing text conversion table compression, a character sequence is loaded from a full-size conversion table. The character sequence is checked for one of plurality of character patterns. Responsive to identifying one of the plurality of character patterns, the character sequence is compressed into a compressed conversion table for the identified one character pattern. Responsive to failing to identify one of the plurality of character patterns, the character sequence is copied into the compressed conversion table. The character sequence from the full-size conversion table is checked for one of the plurality of character patterns including a repeating character sequence, a ramping character sequence, and a repeating high byte character sequence.

15 Claims, 8 Drawing Sheets

AT BUILD TIME:

AT RUNTIME:

FIG. 2 AT BUILD TIME:
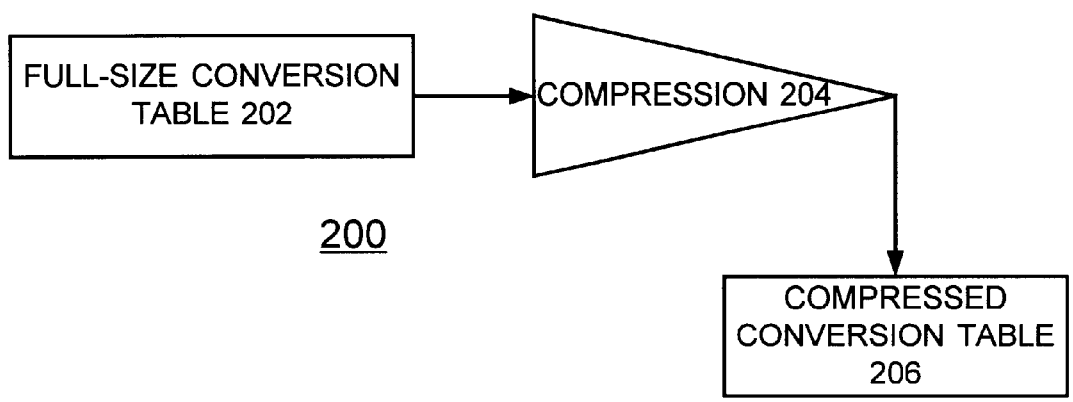
FIG. 3 AT RUNTIME:
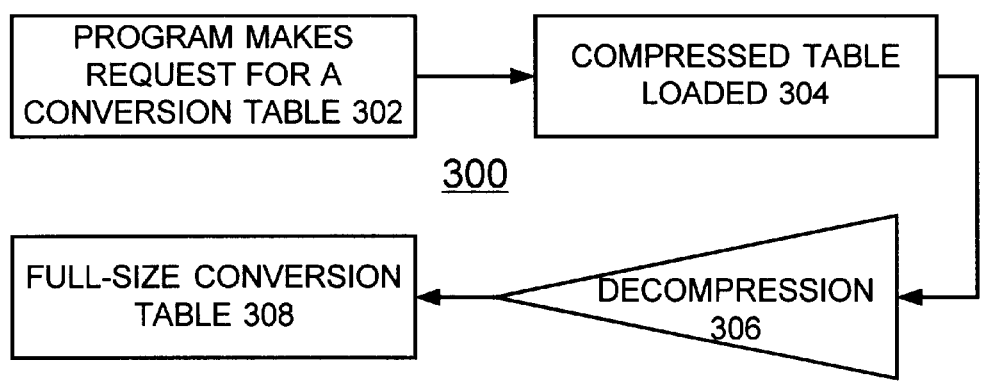

FIG. 4

REPEATING CHARACTER SEQUENCE 400

0x0705    0x0705    0x0705    0x0705    0x0705    0x0705

COMPRESSED REPEATING CHARACTER SEQUENCE 402

0xFFFF    0x0006    0x0705
↑           ↑          ↑ CHARACTER 408 THAT REPEATS
│     NUMBER 406 TIMES
│     CHARACTER REPEATS
REPEATING SEQUENCE
SIGNAL 404

FIG. 5

RAMPING CHARACTER SEQUENCE 500

0x0041    0x0042    0x0043    0x0044    0x00045

COMPRESSED RAMPING CHARACTER SEQUENCE 502

0xFFFE    0x0005    0x0041
↑           ↑          ↑ STARTING CHARACTER 508 OF THE RAMP
│     NUMBER 506 OF
│     CHARACTERS IN SEQUENCE
RAMPING SEQUENCE
SIGNAL 504

FIG. 6

HIGH-BYTE CHARACTER SEQUENCE 600

0x0814    0x0816    0x0800    0x0832    0x0830    0x0833    0x0831

COMPRESSED HIGH-BYTE CHARACTER SEQUENCE 602

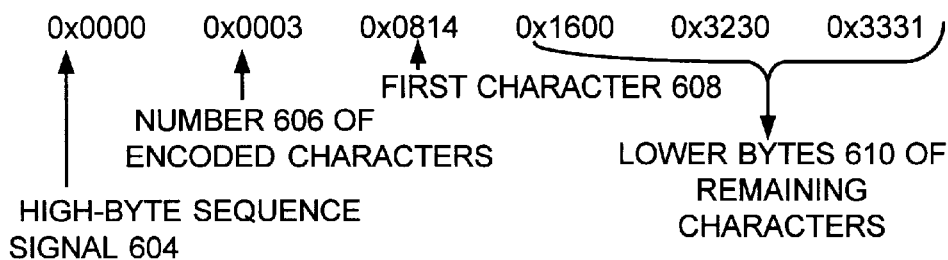

0x0000    0x0003    0x0814    0x1600    0x3230    0x3331

- 0x0000 — HIGH-BYTE SEQUENCE SIGNAL 604
- 0x0003 — NUMBER 606 OF ENCODED CHARACTERS
- 0x0814 — FIRST CHARACTER 608
- 0x1600 0x3230 0x3331 — LOWER BYTES 610 OF REMAINING CHARACTERS

FIG. 7

PADDING A CLEARTEXT SIGNAL CHARACTER 700

0x000A    0x1F1F    0xFFFF    0x000B    0x0000

COMPRESSED CHARACTER SEQUENCE 702

0x000A    0x1F1F    0xFFFF    0x0000    0x000B    0x0000

- 0xFFFF — REPEATING SEQUENCE SIGNAL 404
- 0x0000 — PAD CHARACTER 704 INDICATING THIS IS NOT ACTUALLY A REPEATING SEQUENCE

METHOD AND COMPUTER PROGRAM PRODUCT FOR IMPLEMENTING TEXT CONVERSION TABLE COMPRESSION

FIELD OF THE INVENTION

The present invention relates generally to the data processing field, and more particularly, relates to a method and computer program product for implementing text conversion table compression.

DESCRIPTION OF THE RELATED ART

Typical data compression techniques in use today employ standard algorithms for analyzing and compacting information. In many applications, these techniques work well. However, it is far more efficient if the compression technique being used possesses foreknowledge of the format of the data. In this case, the technique can be tailored to suit the patterns present in the data.

Many applications developed by International Business Machines Corp. are real time national language support (NLS) enabled. That is, the applications need to be able to convert character data between different character sets and encoding schemes on-the-fly. A common way of achieving this conversion is to maintain a conversion table that maps characters in one codepage to those in another. Often, many different character sets and encoding schemes are supported by any given application, so it follows that the application needs to possess conversion tables for each of the sets it supports.

With performance in mind, for any given pair of codepages X and Y, it is best to have a corresponding pair of mappings where:

$$M1:X->Y$$

$$M2:Y->X$$

That is, M1 maps a character in X to its corresponding character in Y, and M2 maps a character in Y to its corresponding character in X.

With an object-oriented programming environment, these mappings can be realized as array-type data structures. If the characters in each character set are treated as or assigned unique integers, then the mapping becomes trivial. For M1, each character of type X(CX) becomes an index into M1's array, an index at which the contents is the corresponding Y value and vice-versa for M2:

$$M1(CX)=CY$$

$$M1(CY)=CX$$

For example, character data in the EBCDIC format must be converted into Unicode for a Java program to manipulate the character data usefully. The reverse is true when Unicode characters from the Java program must be converted into EBCDIC format for other programs.

With performance in mind, the fastest way to convert a string of EBCDIC characters into a string of Unicode characters is to use the technique described above. That is use a direct table lookup for each character. For a given string of n characters, this provides a O(n) solution.

To achieve a set level of performance, the conversion tables themselves must be created so that there is very little overhead in the lookup. That is, they must be fully expanded to provide a one-to-one mapping of any character indices used. There are some exceptions to this. Depending on the codepage being converted, some character sets cannot always provide a one-to-one mapping for all characters due to linguistic differences, but in general, a one-to-one mapping is accepted.

In a product, such as IBM AS/400 Toolbox for Java, there are many supported codepages, each requiring its own two conversion tables: Unicode->codepage and codepage->Unicode. For double-byte character sets, sometimes known as graphic character sets, such as Japanese and Korean, these tables can become rather large. Among the double-byte character sets, as well as Unicode, each character is assigned a 16-bit integer value. As a result, the entire character set will comprise $2^{16}$, or 65536, distinct values. With each value taking up 2 bytes itself, one conversion table will comprise 128 KB of memory, not including the overhead associated with creating such an array in an object-oriented environment. At two tables per codepage, the total is now up to 256 KB. If the Toolbox included 10 double-byte languages, for example, this would mean an increase in the size of the product by more than 2 MB.

It is desirable to reduce the size of conversion tables, for example, for viable and timely transmission of the application over the Internet, and for reduced memory requirements for local storage. A need exists for an effective technique for compressing the text conversion tables at build time.

SUMMARY OF THE INVENTION

A principal object of the present invention is to provide a method and computer program product for implementing text conversion table compression. Other important objects of the present invention are to provide such method and computer program product for implementing text conversion table compression substantially without negative effect; and that overcome many of the disadvantages of prior art arrangements.

In brief, a method and computer program product are provided for implementing text conversion table compression. For implementing text conversion table compression, a character sequence is loaded from a full-size conversion table. The character sequence is checked for one of plurality of character patterns. Responsive to identifying one of the plurality of character patterns, the character sequence is compressed into a compressed conversion table for the identified one character pattern. Responsive to failing to identify one of the plurality of character patterns, the character sequence is copied into the compressed conversion table.

In accordance with features of the invention, the character sequence from the full-size conversion table is checked for one of the plurality of character patterns including a repeating character sequence, a ramping character sequence, and a repeating high byte character sequence.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a block diagram representation illustrating build time text conversion table compression logical functions in accordance with the preferred embodiment;

FIG. 3 is a block diagram representation illustrating run time text conversion table compression logical functions in accordance with the preferred embodiment;

FIG. 4 is a diagram illustrating an exemplary repeating character sequence together with a corresponding compression sequence in accordance with the preferred embodiment;

FIG. 5 is a diagram illustrating an exemplary ramping character sequence together with a corresponding compression sequence in accordance with the preferred embodiment;

FIG. 6 is a diagram illustrating an exemplary character sequence with repeating high bytes together with a corresponding compression sequence in accordance with the preferred embodiment;

FIG. 7 is a diagram illustrating an exemplary character sequence with a repeating sequence signal character together with a corresponding compression sequence in accordance with the preferred embodiment;

DETAILED DESCRIPTION OF THE PREFERRED EMBODIMENTS

Figure 1A:
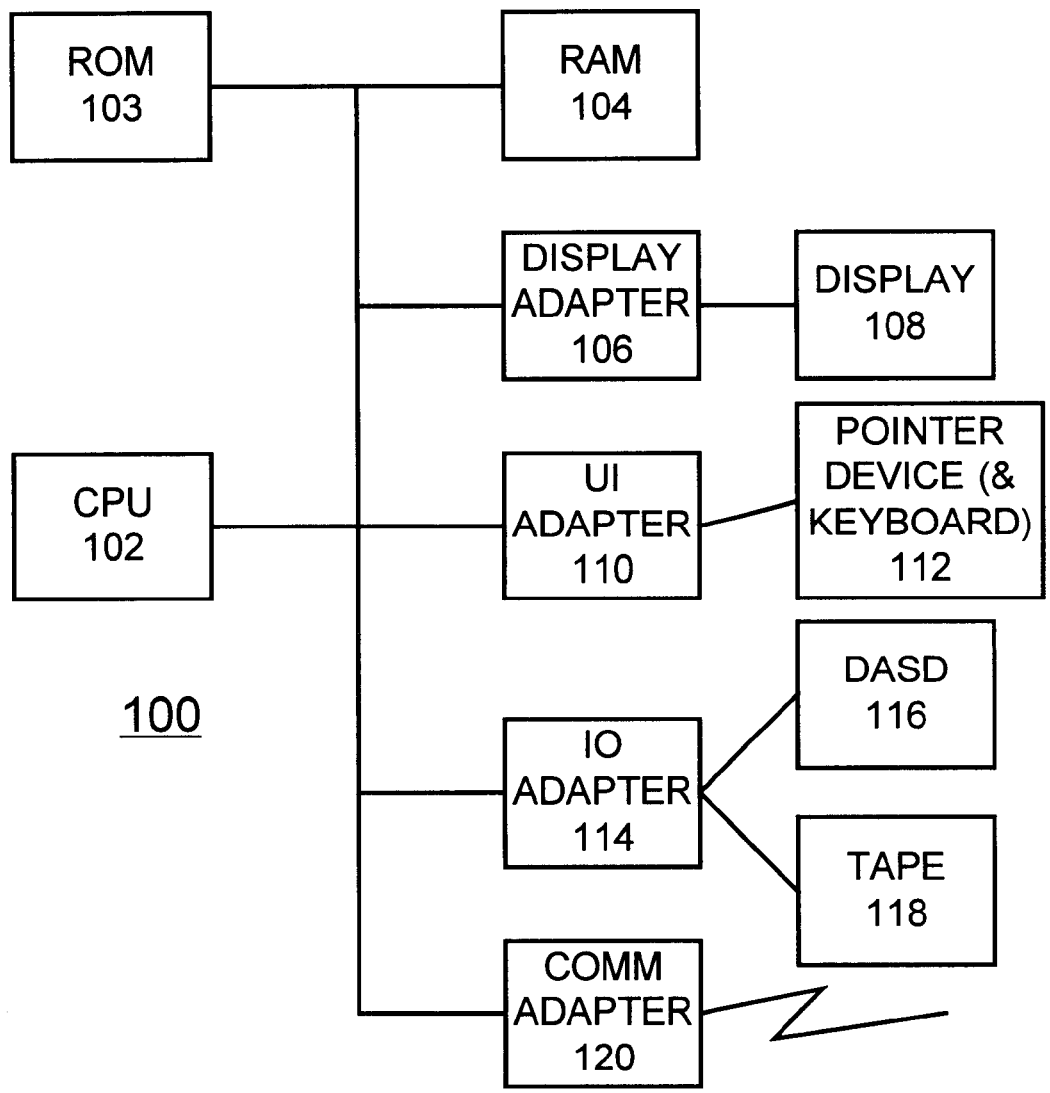
FIGS. 1A and 1B are block diagram representations illustrating a computer system and operating system for implementing a method and computer program product for implementing text conversion table compression in accordance with the preferred embodiment.
Figure 1B:
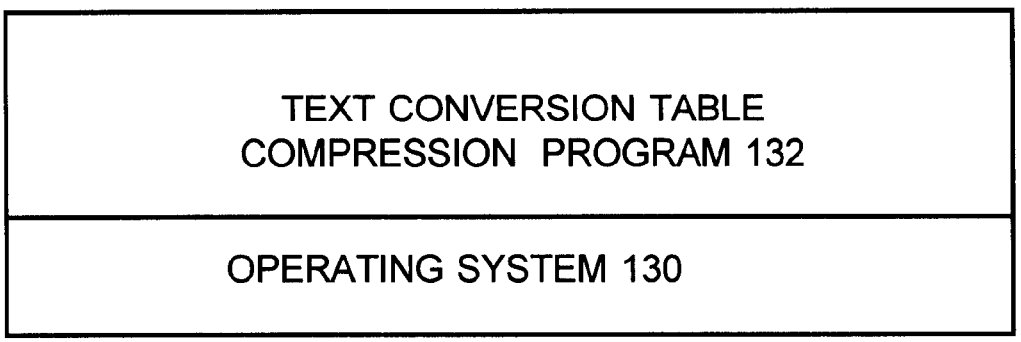

Having reference now to the drawings, in FIGS. 1A and 1B, there is shown a computer or data processing system generally designated by the reference character 100 for carrying out the limited time advertisement method of the preferred embodiment. As shown in FIG. 1A, computer system 100 includes a central processor unit (CPU) 102, a read only memory 103, a random access memory 104, a display adapter 106 coupled to a display 108. CPU 102 is connected to a user interface (UI) adapter 110 connected to a pointer device and keyboard 112. CPU 102 is connected to an input/output (IO) adapter 114 connected to a direct access storage device (DASD) 116 and a tape unit 118. CPU 102 is connected to a communications adapter 120 providing a communications function. It should be understood that the present invention is not limited to a computer model with a single CPU, or other single component architectures as shown in FIG. 1A.

As shown in FIG. 1B, computer system 100 includes an operating system 130 and a text conversion table compression program 132 of the preferred embodiment.

In FIG. 2, there is shown logical functions for build time text conversion table compression of the preferred embodiment generally designated by the reference character 200. As shown in FIG. 2, build time text conversion table compression logical functions 200 includes a full size conversion table 202. Full size conversion table 202 is obtained from a known source. A total number of tables is equal to 2 times the number of supported codepages; with one table to convert from codepage to Unicode and one table to convert from Unicode to codepage. Each full size conversion table 202 is compressed by a compression function 204 of the preferred embodiment. A corresponding compressed conversion table 206 produced by the compression function 204 is stored in compressed format.

In FIG. 3, there is shown logical functions for run time text compressed conversion table decompression of the preferred embodiment generally designated by the reference character 300. As shown in FIG. 3, a program makes a request for a conversion table as indicated in a block 302. Then a compressed conversion table is loaded as indicated in a block 304. The compressed conversion table is decompressed by a decompression function 306 to produce a corresponding full size conversion table as indicated in a block 308.

In accordance with features of the invention, text conversion table compression program 132 and compression function 204 of the preferred embodiment use three processes to compress the sequence of characters in the full-size conversion table 202. The three processes include a repetition or repeating compression process, a ramping compression process and a repeating high byte compression process. All three processes are used to compress the sequence of characters in the table 202. If none of the three processes apply, then character sequence is copied as is. Full-size conversion table 202 is statically resident, multiple copies of the same table 202 are useless and requires more memory. Full-size conversion table 202 allows direct index for character lookup with no extra runtime algorithm required to translate a character.

In accordance with features of the invention, both a ramping compression process and a repeating compression process for a sequence of N characters always compresses to 3 characters. A repeating high bytes compression process for a sequence of N characters, where N is odd, compresses to 3+½(N−1) characters; and where N is even, compresses to 3+½(N−2) characters in the sequence plus the last character which remains uncompressed. The ramping compression process and the repeating compression process are useful only if the sequence being compressed contains at least 4 characters. The repeating high bytes compression process is useful only if the ramping compression process and the repeating compression process are not useful, and the sequence being compressed contains at least 6 characters. The compression processes of the preferred embodiment are particularly suited for double byte conversion tables.

FIG. 4 is a diagram illustrating an exemplary repeating character sequence 400 together with a corresponding compression sequence 402 in accordance with the preferred embodiment. The repeating character sequence 400 includes the repeating character 0x0705 that is repeated six times. The repeating character sequence 400 compresses to the corresponding compression sequence 402 that includes a predefined repeating sequence signal 404, such as 0xFFFF, a number 406 indicating times that the character repeats, such as 0x0006, and the character 408 that repeats, such as 0x0705.

FIG. 5 is a diagram illustrating an exemplary ramping character sequence 500 together with a corresponding compression sequence 502 in accordance with the preferred embodiment. The ramping character sequence 500 includes characters 0x0041 through 0x0045 in increasing, sequential order. The ramping character sequence 500 compresses to the corresponding compression sequence 402 that includes a predefined ramping sequence signal 504, such as 0xFFFE, a number 506 indicating the number of characters in the ramping sequence, such as 0x0005, and a character 508 that starts the ramp, such as 0x00041.

FIG. 6 is a diagram illustrating an exemplary character sequence 600 with repeating high bytes together with a corresponding compression sequence 602 in accordance with the preferred embodiment. The character sequence 600 with repeating high bytes compresses to the high byte compression sequence 602. The high byte compression sequence 602 includes a predefined high byte signal 604, such as 0x0000, a number 606 of encoded characters, such as 0x0003, a first character 608, such as 0x0814, and lower bytes 610 of remaining characters, such as 0x1600, 0x3230, and 0x3331.

FIG. 7 is a diagram illustrating an exemplary character sequence 700 with a repeating sequence signal character together with a corresponding compression sequence 702 in accordance with the preferred embodiment. The compression sequence 702 includes a pad character 704 that is inserted after the character repeating sequence signal 404. The pad character 704 indicates that the character repeating sequence signal 404 is not actually a repeating sequence.

Figure 8:
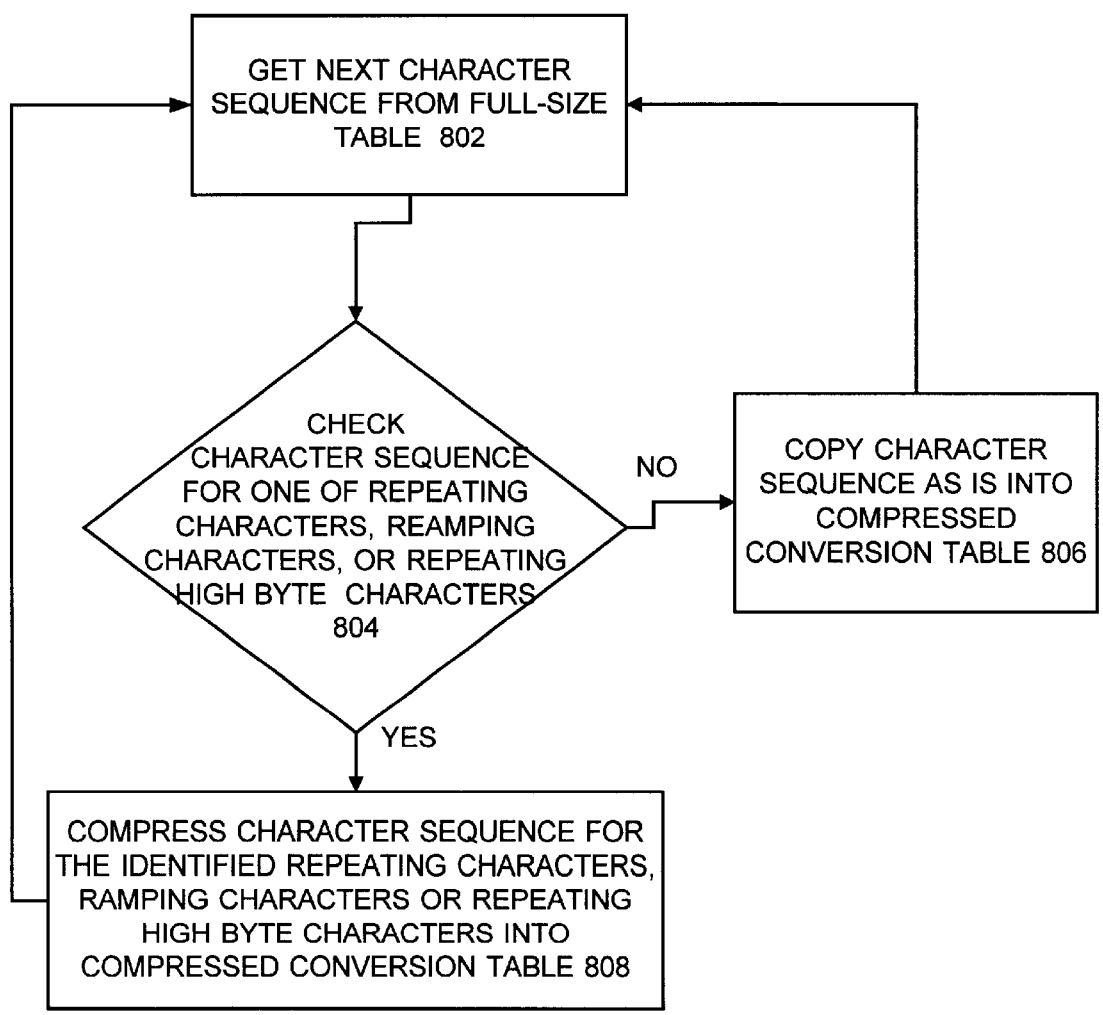
FIG. 8 is a flow chart illustrating sequential steps for build time compression in accordance with the preferred embodiment.

FIG. 8 is a flow chart illustrating sequential steps for build time compression process in accordance with the preferred embodiment. As indicated in a block 802, a character sequence is obtained from the full-size conversion table. Checking the character sequence for one of plurality of character patterns including repeating characters, ramping characters, and repeating high byte characters is performed as indicated in a decision block 804. If none of the three character patterns apply, then the character sequence is copied as is into a compressed conversion table. As indicated in a block 808, if one of the three character patterns apply, then the character sequence is compressed for the identified character pattern, as illustrated and described with respect to FIGS. 4, 5, and 6. A next character sequence is obtained from the full-size conversion table at block 802 and the sequential steps are repeated.

Figure 9:
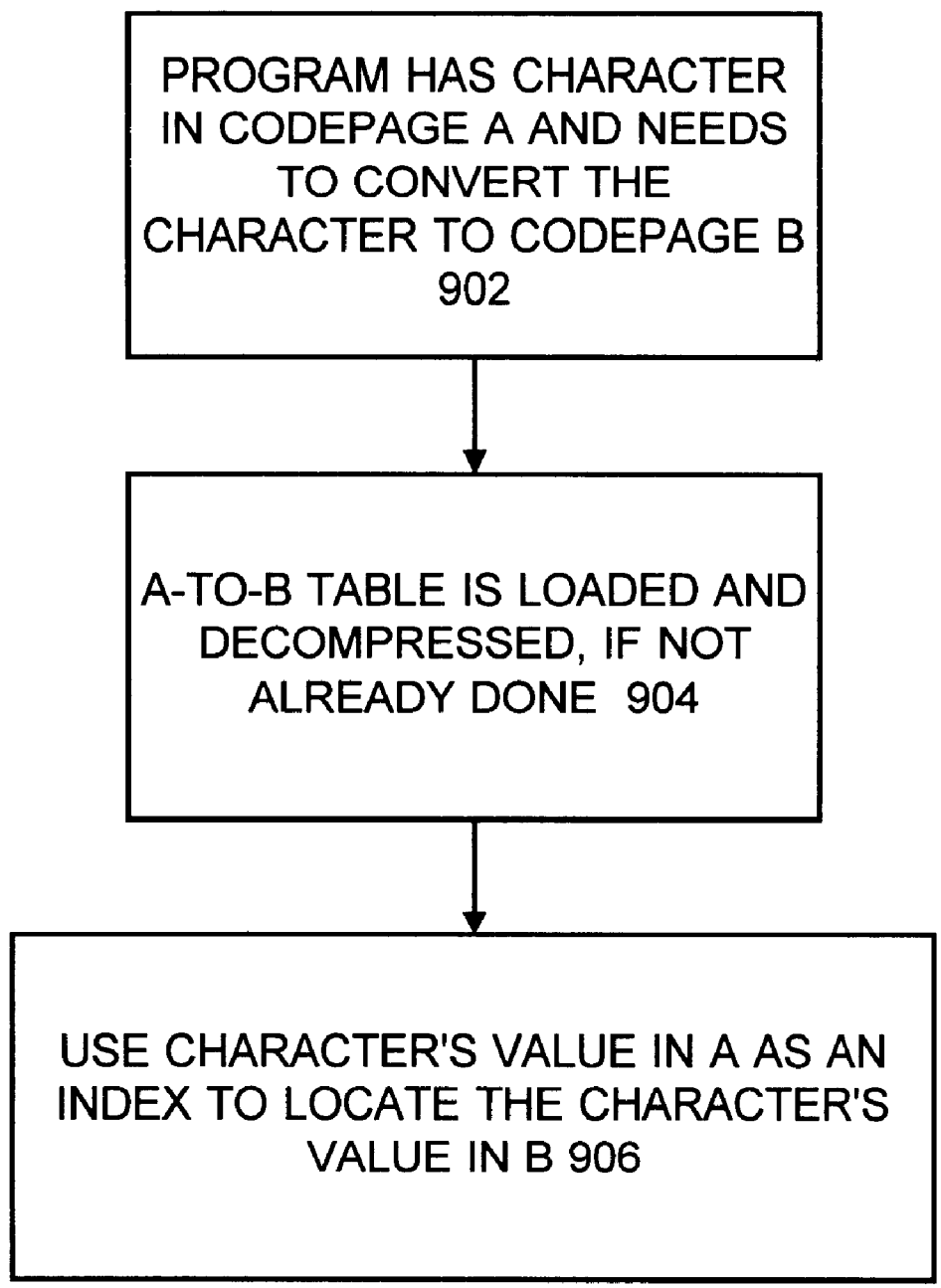
FIG. 9 is a flow chart illustrating sequential steps for run time lookup in accordance with the preferred embodiment.

FIG. 9 is a flow chart illustrating sequential steps for run time lookup process in accordance with the preferred embodiment. As indicated in a block 902, a program has a character in codepage A and needs to convert it to codepage B. The A-to-B table is loaded and decompressed, if not already done as indicated in a block 904. The character's value in A is used as the index to locate the character's value in B as indicated in a block 906. For example, X has a value 0xE7 in codepage 037 (USA EBCDIC) and X has a value 0x0058 in Unicode, for lookup as follows.

Unicode to codepage 037 (0x0058)=0xE7
codepage 037 to Unicode (0xE7)=0x0058

Figure 10:
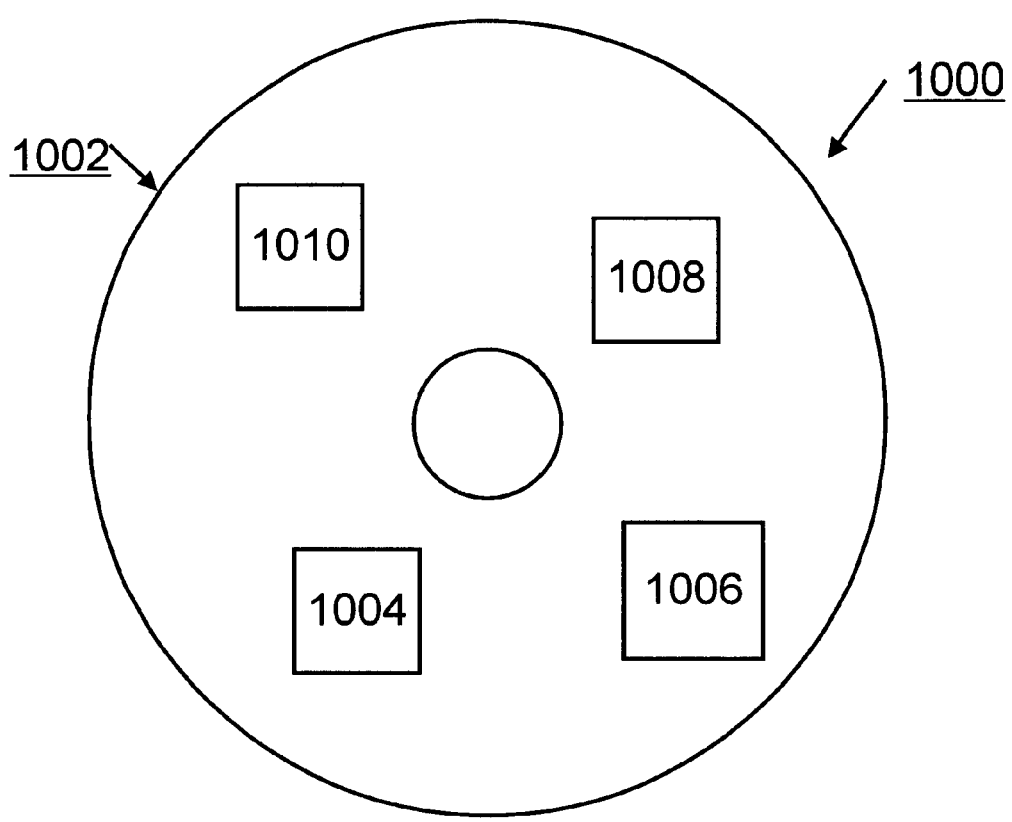
FIG. 10 is a block diagram illustrating a computer program product in accordance with the preferred embodiment.

Referring now to FIG. 10, an article of manufacture or a computer program product 1000 of the invention is illustrated. The computer program product 1000 includes a recording medium 1002, such as, a floppy disk, a high capacity read only memory in the form of an optically read compact disk or CD-ROM, a tape, a transmission type media such as a digital or analog communications link, or a similar computer program product. Recording medium 1002 stores program means 1004, 1006, 1008, 1010 on the medium 1002 for carrying out the methods for implementing text conversion table compression of the preferred embodiment in the system 100 of FIG. 1.

A sequence of program instructions or a logical assembly of one or more interrelated modules defined by the recorded program means 1004, 1006, 1008, 1010, direct the text conversion table compression system 100 for implementing text conversion table compression of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing text conversion table compression of a full-size conversion table into a compressed conversion table, said full-size conversion table for mapping characters in one codepage to another codepage; said computer-implemented method comprising the steps of:

loading said full-size conversion table, loading a character sequence from said full-size conversion table;

checking said loaded character sequence for one of plurality of character patterns;

responsive to identifying one of said plurality of character patterns, compressing said character sequence for said identified one character pattern into said compressed conversion table; and responsive to failing to identify one of said plurality of character patterns, copying said character sequence into said compressed conversion table.

2. A computer-implemented method for implementing text conversion table compression as recited in claim 1 wherein the steps of loading said character sequence from said full-size conversion table and checking said character sequence for one of plurality of character patterns, responsive to identifying one of said plurality of character patterns, compressing said character sequence for said identified one character pattern into said compressed conversion table and responsive to failing to identify one of said plurality of character patterns, copying said character sequence into said compressed conversion table are sequentially repeated for each character sequence from said full-size conversion table.

3. A computer-implemented method for implementing text conversion table compression as recited in claim 1 wherein the step of checking said character sequence for one of plurality of character patterns includes the step of checking said character sequence for a plurality of repeating characters in said character sequence from said full-size conversion table.

4. A computer-implemented method for implementing text conversion table compression as recited in claim 1 wherein the step of checking said character sequence for one of plurality of character patterns includes the step of checking said character sequence for a plurality of ramping characters in said character sequence from said full-size conversion table.

5. A computer-implemented method for implementing text conversion table compression as recited in claim 1 wherein the step of checking said character sequence for one of plurality of character patterns includes the step of checking said character sequence for a plurality of repeating high byte characters in said character sequence from said full-size conversion table.

6. A computer-implemented method for implementing text conversion table compression as recited in claim 1 wherein the step responsive to identifying one of said plurality of character patterns, of compressing said character sequence for said identified one character pattern into said compressed conversion table includes the steps, responsive to an identified repeating character pattern, providing a compressed character sequence of three characters, said compressed character sequence including a repeating sequence signal, a number of times the repeating character repeats, and the repeating character.

7. A computer-implemented method for implementing text conversion table compression as recited in claim 1 wherein the step responsive to identifying one of said plurality of character patterns, of compressing said character sequence for said identified one character pattern into said compressed conversion table includes the steps of, responsive to an identified ramping character pattern, providing a compressed character sequence of three characters, said compressed character sequence including a ramping sequence signal, a number of characters in the ramping sequence, and a starting character of the ramping sequence.

8. A computer-implemented method for implementing text conversion table compression as recited in claim 1 wherein the step responsive to identifying one of said plurality of character patterns, of compressing said character sequence for said identified one character pattern into said compressed conversion table includes the steps of responsive to an identified repeating high byte character pattern, providing a compressed character sequence including a high byte sequence signal, a number of encoded characters, a first character, and encoded characters including lower bytes of remaining characters in said identified repeating high byte character pattern.

9. A computer-implemented method for implementing text conversion table compression as recited in claim 1 further includes the steps of identifying a predefined signal in said character sequence from said full-size conversion table and inserting a predefined padding character after said predefined signal.

10. A computer program product for implementing text conversion table compression of a full-size conversion table into a compressed conversion table, in a computer system including a central processor unit, said full-size conversion table for mapping characters in one codepage to another codepage; said computer program product including a plurality of computer executable instructions stored on a computer readable medium, wherein said instructions, when executed by said central processor unit, cause the central processor unit to perform the steps of:

loading said full-size conversion table, loading a character sequence from said full-size conversion table;

checking said character sequence for one of plurality of character patterns;

responsive to identifying one of said plurality of character patterns, compressing said character sequence for said identified one character pattern into said compressed conversion table; and responsive to failing to identify one of said plurality of character patterns, copying said character sequence into said compressed conversion table.

11. A computer program product for implementing text conversion table compression in a computer system as recited in claim 10 wherein the step of checking said character sequence for one of plurality of character patterns includes the steps of checking said character sequence for a repeating character sequence, checking said character sequence for a ramping character sequence, and checking said character sequence for a repeating high byte character sequence.

12. A computer program product for implementing text conversion table compression in a computer system as recited in claim 11 wherein the step of responsive to identifying one of said plurality of character patterns, compressing said character sequence for said identified one character pattern into said compressed conversion table includes the steps of starting a compression sequence with a predefined character signal for said identified one character pattern.

13. A computer-implemented method for implementing text conversion table compression of a full-size conversion table into a compressed conversion table, said full-size conversion table for mapping characters in one codepage to another codepage; said computer-implemented method comprising the steps of:

loading said full-size conversion table, loading a character sequence from said full-size conversion table;

checking said character sequence for one of a repeating character sequence, a ramping character sequence; and a repeating high byte character sequence;

responsive to identifying one of said repeating character sequence, said ramping character sequence; or said repeating high byte character sequence, compressing said character sequence into said compressed conversion table responsive to said identified one character sequence; and responsive to failing to identify one of said plurality of character patterns, copying said character sequence into said compressed conversion table.

14. A computer-implemented method for implementing text conversion table compression as recited in claim 13 wherein the step of compressing said character sequence into a compressed conversion table responsive to said identified one character sequence includes the step of providing a signal character indicating one of a repeating character sequence, a ramping character sequence; or a repeating high byte character sequence for said identified one character sequence.

15. A computer-implemented method for implementing text conversion table compression as recited in claim 14 further includes the steps of identifying a predefined signal in said character sequence from said full-size conversion table and inserting a predefined padding character after said predefined signal in said compressed conversion table.

* * * * *